(12) United States Patent
Fukuyo

(10) Patent No.: US 11,164,751 B2
(45) Date of Patent: Nov. 2, 2021

(54) ETCHING METHOD

(71) Applicant: SHOWA DENKO K.K., Tokyo (JP)

(72) Inventor: Tomoyuki Fukuyo, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 40 days.

(21) Appl. No.: 16/611,987

(22) PCT Filed: Jun. 1, 2018

(86) PCT No.: PCT/JP2018/021277
§ 371 (c)(1),
(2) Date: Nov. 8, 2019

(87) PCT Pub. No.: WO2018/225661
PCT Pub. Date: Dec. 13, 2018

(65) Prior Publication Data
US 2021/0134603 A1    May 6, 2021

(30) Foreign Application Priority Data

Jun. 8, 2017  (JP) .............................. JP2017-113425

(51) Int. Cl.
*H01L 21/311* (2006.01)
*H01L 21/3065* (2006.01)

(52) U.S. Cl.
CPC .... *H01L 21/31116* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 4,374,698 A * | 2/1983 | Sanders | H01L 21/31116 |
| | | | 204/192.32 |
| 4,717,447 A | 1/1988 | Dieleman et al. | |
| 5,279,705 A | 1/1994 | Tanaka | |
| 5,302,236 A * | 4/1994 | Tahara | H01L 21/31144 |
| | | | 216/67 |

(Continued)

FOREIGN PATENT DOCUMENTS

| | | |
|---|---|---|
| DE | 42 32 475 A1 | 3/1994 |
| EP | 0 482 519 A1 | 4/1992 |

(Continued)

OTHER PUBLICATIONS

Communication dated Sep. 16, 2020 by the Intellectual Property Office of Singapore in application No. 11201910453T.

(Continued)

*Primary Examiner* — Roberts P Culbert
(74) *Attorney, Agent, or Firm* — Sughrue Mion, PLLC

(57) ABSTRACT

An etching method capable of controlling the etching rate of a silicon nitride layer and the etching rate of a silicon oxide layer to be approximately equal to each other. A body to be treated including a laminated film (5) having silicon oxide layers (2) and silicon nitride layers (3) laminated on top of each other is treated with an etching gas containing a halocarbon compound containing carbon, bromine, and fluorine. Then, the silicon oxide layer (2) and the silicon nitride layer (3) are etched at approximately equal etching rates.

4 Claims, 1 Drawing Sheet

(56) References Cited

U.S. PATENT DOCUMENTS

| | | | | |
|---|---|---|---|---|
| 6,492,068 | B1* | 12/2002 | Suzuki | ............. H01L 21/31138 |
| | | | | 257/E21.256 |
| 2001/0035781 | A1 | 11/2001 | Vaucher et al. | |
| 2010/0270654 | A1 | 10/2010 | Hayashi et al. | |
| 2013/0105728 | A1 | 5/2013 | Umezaki et al. | |

FOREIGN PATENT DOCUMENTS

| | | |
|---|---|---|
| EP | 0 482 519 B1 | 7/1996 |
| EP | 3 506 335 A1 | 7/2019 |
| JP | 55-138834 A | 10/1980 |
| JP | 57-49235 A | 3/1982 |
| JP | 03-208367 A | 9/1991 |
| JP | 05-152255 A | 6/1993 |
| JP | 05-247673 A | 9/1993 |
| JP | 2000-208488 A | 7/2000 |
| JP | 2003-533008 A | 11/2003 |
| JP | 2006-108484 A | 4/2006 |
| JP | 2012-114402 A | 6/2012 |
| KR | 10-1995-0009938 B1 | 9/1995 |
| TW | 200842971 A | 11/2008 |
| WO | 2007/116964 A1 | 10/2007 |

OTHER PUBLICATIONS

Communication dated May 25, 2020 by the European Patent Office in application No. 18813647.7.

International Preliminary Report on Patentability with the translation of Written Opinion dated Dec. 19, 2019 issued by the International Bureau in International Application No. PCT/JP2018/021277.

International Search Report of PCT/JP2018/021277 dated Jul. 10, 2018 [PCT/ISA/210].

* cited by examiner

ETCHING METHOD

CROSS REFERENCE TO RELATED APPLICATIONS

This application is a National Stage of International Application No. PCT/JP2018/021277, filed Jun. 1, 2018, claiming priority to Japanese Patent Application No. 2017-113425, filed Jun. 8, 2017.

TECHNICAL FIELD

The present invention relates to an etching method.

BACKGROUND ART

Semiconductor manufacturing processes include a process of etching a laminated film having silicon oxide layers and silicon nitride layers laminated on top of each other using an etching gas with a resist, an organic film, or a carbon film as a mask. For example, PTL 1 discloses a method for etching the laminated film using an etching gas containing 1,3,3,3-tetrafluoropropene, an additive gas, and an inert gas. However, the bond energy of the Si—N bond is lower than that of the Si—O bond. Therefore, the etching rate of the silicon nitride layer is higher by about 1.2 times than the etching rate of the silicon oxide layer.

Therefore, when deep etching forming a through-hole with a high aspect ratio of an aspect ratio exceeding 20 is applied to the laminated film, the rate at which the silicon nitride layer is etched in the planar direction orthogonal to the thickness direction is higher than the rate at which the silicon oxide layer is etched in the thickness direction. Therefore, there has been a possibility that the silicon nitride layer is excessively etched in the planar direction, which causes abnormalities in the etching shape.

CITATION LIST

Patent Literature

PTL 1: JP 2012-114402 A

SUMMARY OF INVENTION

Technical Problem

It is an object of the present invention to provide an etching method capable of controlling the etching rate of a silicon nitride layer and the etching rate of a silicon oxide layer to be approximately equal to each other.

Solution to Problem

In order to solve the above-described problem, one aspect of the present invention is as described in [1] to [4] below.

[1] An etching method includes an etching process of treating a body to be treated including a laminated film having a silicon oxide layer and a silicon nitride layer laminated each other with an etching gas containing a halocarbon compound containing carbon, bromine, and fluorine to etch both the silicon oxide layer and the silicon nitride layer.

[2] The etching method according to [1] above, in which the halocarbon compound is at least one of dibromodifluoromethane and bromopentafluoroethane.

[3] The etching method according to [1] or [2] above, in which the etching gas further contains an inert gas.

[4] The etching method according to any one of [1] to [3] above, in which the etching is performed using a plasma gas obtained by plasmolyzing the etching gas in the etching process.

Advantageous Effects of Invention

When the body to be treated including the laminated film having the silicon oxide layer and the silicon nitride layer laminated each other is etched by the etching method of the present invention, the etching rate of the silicon nitride layer and the etching rate of the silicon oxide layer can be controlled to be approximately equal to each other.

DESCRIPTION OF EMBODIMENTS

Figure 1:
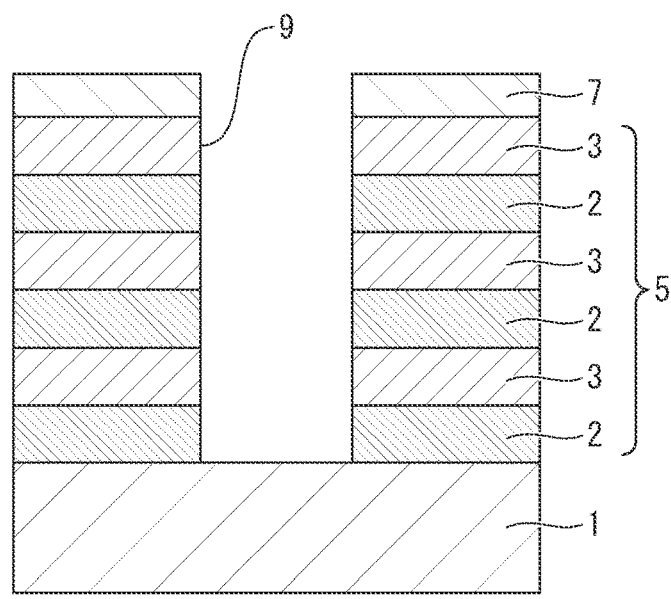
FIG. 1 is a cross-sectional view of a body to be treated explaining an etching method according to one embodiment of the present invention.

One embodiment of the present invention is described below. This embodiment gives an example of the present invention and the present invention is not limited to this embodiment. This embodiment can be variously altered or modified and such alternations or modifications may also be included in the present invention.

An etching method of this embodiment includes an etching process of treating a body to be treated including a laminated film having silicon oxide layers (SiOx layer) and silicon nitride layers laminated on top of each other with an etching gas containing a halocarbon compound containing carbon, bromine, and fluorine to etch both the silicon oxide layers and the silicon nitride layers.

When the body to be treated including the laminated film having the silicon oxide layers and the silicon nitride layers laminated on top of each other is etched by the etching method of this embodiment, a ratio of the etching rate of the silicon nitride layer to the etching rate of the silicon oxide layer ([Etching rate of silicon nitride layer]/[Etching rate of silicon oxide layer]) can be arbitrarily controlled in the range of 0.8 or more and less than 1.5 depending on the etching conditions. Therefore, the etching method of this embodiment can control the etching rate of the silicon nitride layer and the etching rate of the silicon oxide layer to be approximately equal to each other. The ratio of the etching rate of the silicon nitride layer to the etching rate of a silicon oxide layer is preferably set to 0.9 or more and less than 1.2.

The type of the halocarbon compound containing carbon, bromine, and fluorine is not particularly limited and at least one of dibromodifluoromethane ($CBr_2F_2$) and bromopentafluoroethane ($C_2BrF_5$) is usable.

The etching gas may contain inert gas together with the halocarbon compound. By performing etching while causing the inert gas to coexist, the silicon oxide layer and the silicon nitride layer can be selectively etched with a high etching rate with respect to a mask. The type of the inert gas is not particularly limited and helium (He), argon (Ar), neon (Ne), krypton (Kr), xenon (Xe), and nitrogen ($N_2$) are mentioned. These inert gases may be used alone or in combination of two or more kinds thereof.

An etching method adopted in the etching process is not particularly limited and a plasma etching method of performing etching using a plasma gas obtained by plasmolyzing an etching gas can be adopted.

Examples of the plasma used for the etching include Capacitively Coupled Plasma (CCP), Electron Cyclotron resonance Plasma (ECP), Helicon Wave Plasma (HWP), Inductively Coupled Plasma (ICP), Surface Wave Plasma (SWP), and the like.

The etching method of such an embodiment is usable in a process of forming a through-hole extending in the thickness direction in a laminated film in which a large number of silicon nitride layers and silicon oxide layers are alternately laminated on a substrate, which is one process in a process of manufacturing a three-dimensional NAND flash memory, for example.

An example of a method for etching a body to be treated including a laminated film having silicon oxide layers and silicon nitride layers laminated on top of each other by the etching method of this embodiment to form a through-hole in the laminated film is described with reference to FIG. 1.

FIG. 1 is a cross-sectional view of the body to be treated in which a through-hole 9 is formed in a laminated film 5. The body to be treated is configured so that the laminated film 5 in which a large number of silicon nitride layers 3 and silicon oxide layers 2 (three layers of each of the silicon nitride layer and the silicon oxide layer 2 in the example of FIG. 1) are alternately laminated is provided on the semiconductor substrate 1. The silicon oxide layer 2 of the laminated film 5 is laminated immediately on the semiconductor substrate 1.

On the silicon nitride layer 3 of the top layer of the laminated film 5, a mask 7 in which a pattern is formed is placed. When etching is performed by the etching method of this embodiment, the laminated film 5 exposed from the mask 7 is etched, so that the through-hole 9 is formed.

The etching method of this embodiment can control the etching rate of the silicon nitride layers 3 and the etching rate of the silicon oxide layers 2 to be approximately equal to each other. When the through-hole 9 is formed in the laminated film 5, it is suppressed that the silicon nitride layers 3 exposed to the inner surface of the through-hole 9 are excessively etched in the planar direction (direction orthogonal to the thickness direction). Therefore, even when deep etching forming the through-hole 9 with a high aspect ratio of an aspect ratio exceeding 20 is applied to the laminated film 5, the through-hole 9 can be formed without causing collapse of the laminated structure of the laminated film 5 or abnormalities in the etching shape as illustrated in FIG. 1.

The present invention is described in more detail giving various test examples below.

Test Example 1

A test piece was obtained by forming a silicon nitride layer on an Si substrate by a plasma chemical vapor deposition method. The film thickness of the silicon nitride layer was set to 500 nm. Inductively coupled plasma etching (ICP etching) was applied to the test piece to etch the silicon nitride layer. The etching conditions are as follows.

Etching device: ICP etching device RIE-200iP manufactured by Samco Inc.
Etching time: 120 seconds
ICP power: 200 W, 500 W, or 800 W
Bias power: 200 W
Pressure: 2 Pa
Etching gas: Mixed gas of 1 part by volume of dibromodifluoromethane and 9 parts by volume of argon
Etching gas flow rate: 100 SCCM When the etching was completed, the film thickness of the silicon nitride layer was measured using an ellipsometer M-550 manufactured by Jasco Corp. Then, the etching rate of the silicon nitride layer was calculated by dividing a difference in the film thickness before and after the etching by the etching time.

Test Example 2

The etching rate of the silicon oxide layer was calculated in the same manner as in Test Example 1 except that a test piece was obtained by forming a silicon oxide layer having a film thickness of 2000 nm in place of the silicon nitride layer on an Si substrate.

Test Example 3

The etching rate of the silicon nitride layer was calculated in the same manner as in Test Example 1 except that the type of the halocarbon compound in the etching gas is changed to carbon tetrafluoride ($CF_4$) from the dibromodifluoromethane.

Test Example 4

The etching rate of the silicon oxide layer was calculated in the same manner as in Test Example 2 except that the type of the halocarbon compound in the etching gas is changed to carbon tetrafluoride ($CF_4$) from the dibromodifluoromethane.

Test Example 5

The etching rate of the silicon nitride layer was calculated in the same manner as in Test Example 3 except that the etching gas was changed to a mixed gas of 1 part by volume of carbon tetrafluoride, 8 parts by volume of argon, and 1 part by volume of oxygen gas.

Test Example 6

The etching rate of the silicon oxide layer was calculated in the same manner as in Test Example 4 except that the etching gas was changed to a mixed gas of 1 part by volume of carbon tetrafluoride, 8 parts by volume of argon, and 1 part by volume of oxygen gas.

TABLE 1

| Halocarbon compound | IPC power (W) | Etching rate (nm/sec) Silicon nitride layer | Etching rate (nm/sec) Silicon oxide layer | Ratio |
|---|---|---|---|---|
| Dibromodifluoromethane | 200 | 1.97 | 1.68 | 1.17 |
|  | 500 | 2.30 | 2.38 | 0.97 |
|  | 800 | 1.93 | 2.13 | 0.91 |
| Carbon tetrafluoride | 200 | 2.37 | 1.68 | 1.41 |
|  | 500 | 3.30 | 2.29 | 1.44 |
|  | 800 | 3.13 | 2.33 | 1.34 |
| Carbon tetrafluoride (mixed with oxygen gas) | 200 | 0.80 | 0.82 | 0.98 |
|  | 500 | 0.90 | 0.68 | 1.32 |

Figure 2:
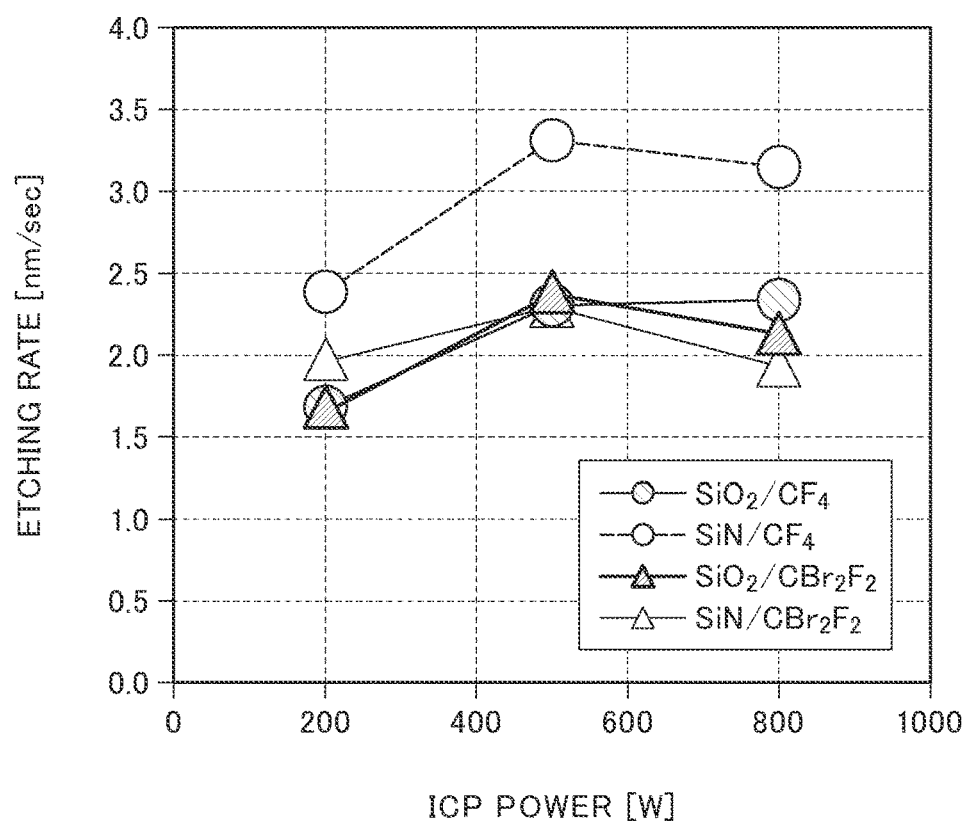
FIG. 2 is a graph illustrating the relationship between ICP power and the etching rate.

The results of the test examples are illustrated in Table 1 and the graph of FIG. 2. The "Ratio" in Table 1 is a ratio ([Etching rate of silicon nitride layer]/[Etching rate of silicon oxide layer]) of the etching rate of the silicon nitride layer to the etching rate of the silicon oxide layer. As is understood from Table 1 and the graph of FIG. 2, when the type of the halocarbon compound in the etching gas was the carbon tetrafluoride, the etching rate of the silicon nitride layer was higher than the etching rate of the silicon oxide layer. Meanwhile, when the type of the halocarbon compound in the etching gas was the dibromodifluoromethane, the etching rate of the silicon oxide layer and the etching rate of the silicon nitride layer were approximately equal to each other (see the column of "Ratio" of Table 1).

By the use of the mixed gas of carbon tetrafluoride, argon, and oxygen gas as the etching gas, the etching rate of the silicon nitride layer can be reduced. However, there is a problem that the etching rate as the entire laminated film having the silicon oxide layers and the silicon nitride layers laminated on top of each other greatly decreases. Furthermore, when oxygen is mixed, a mask, such as photoresist, is easily etched in the etching of a pattern substrate.

When the dibromodifluoromethane is used, the etching rate of the silicon oxide layer and the etching rate of the silicon nitride layer can be controlled to be approximately equal to each other without reducing the etching rate as the entire laminated film.

REFERENCE SIGNS LIST 1 semiconductor substrate
2 silicon oxide layer
3 silicon nitride layer
5 laminated film
7 mask
9 through-hole

The invention claimed is:

1. An etching method comprising:
an etching step of treating a body to be treated including a laminated film having a silicon oxide layer and a silicon nitride layer laminated each other with an etching gas containing dibromodifluoromethane to etch both the silicon oxide layer and the silicon nitride layer, wherein
the etching step includes performing etching using a plasma gas obtained by plasmolyzing an etching gas, and
a ratio of etching rate of the silicon nitride layer to etching rate of silicon oxide is 0.8 or more and less than 1.5.

2. The etching method according to claim 1, wherein the laminated film in which the plurality of silicon nitride layers and a plurality of silicon oxide layers are alternately laminated is provided on the semiconductor substrate.

3. The etching method according to claim 1, wherein the etching gas further contains an inert gas.

4. The etching method according to claim 3, wherein the etching is performed using a plasma gas obtained by plasmolyzing the etching gas in the etching step.

* * * * *